US009053952B2

(12) United States Patent
Arnold et al.

(10) Patent No.: US 9,053,952 B2
(45) Date of Patent: Jun. 9, 2015

(54) SILICON SHAPING

(71) Applicant: Apple Inc., Cupertino, CA (US)

(72) Inventors: Shawn X. Arnold, San Jose, CA (US); Matthew E. Last, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 198 days.

(21) Appl. No.: 13/631,769

(22) Filed: Sep. 28, 2012

(65) Prior Publication Data

US 2014/0091439 A1   Apr. 3, 2014

(51) Int. Cl.
*H01L 29/02* (2006.01)
*H01L 21/78* (2006.01)
*H01L 21/762* (2006.01)
*H01L 29/06* (2006.01)
*H01L 21/683* (2006.01)
*H01L 21/822* (2006.01)

(52) U.S. Cl.
CPC ........ *H01L 29/0657* (2013.01); *H01L 21/6836* (2013.01); *H01L 21/822* (2013.01); *H01L 21/78* (2013.01); *H01L 21/6835* (2013.01); H01L 2221/68318 (2013.01); H01L 2221/68327 (2013.01); H01L 2221/6834 (2013.01); H01L 2221/68381 (2013.01)

(58) Field of Classification Search
CPC .................................................... H01L 21/822
See application file for complete search history.

(56) References Cited

U.S. PATENT DOCUMENTS

| 5,071,792 | A | 12/1991 | VanVonno et al. | |
| 7,989,319 | B2 | 8/2011 | Grivna et al. | |
| 2002/0053715 | A1 | 5/2002 | Kim et al. | |
| 2004/0043614 | A1* | 3/2004 | Koizumi | 438/689 |
| 2004/0235272 | A1* | 11/2004 | Howard et al. | 438/462 |
| 2006/0046438 | A1* | 3/2006 | Kirby | 438/464 |
| 2007/0176192 | A1* | 8/2007 | Leatherdale et al. | 257/98 |
| 2008/0012096 | A1* | 1/2008 | Sin et al. | 257/620 |
| 2008/0174012 | A1* | 7/2008 | Otsuki | 257/737 |
| 2009/0224283 | A1* | 9/2009 | Huang et al. | 257/103 |
| 2010/0261335 | A1 | 10/2010 | Andry et al. | |
| 2013/0029445 | A1* | 1/2013 | Kim et al. | 438/33 |

FOREIGN PATENT DOCUMENTS

WO   WO 2010/138267 A2   12/2010

OTHER PUBLICATIONS

Burghartz et al, "Ultra-Thin Chips and Related Applications, A New Paradigm in Silicon Technology", Proceedings of the European Solid State Device Research Conference, 2009, pp. 1-8.

(Continued)

*Primary Examiner* — Angel Roman
(74) *Attorney, Agent, or Firm* — Downey Brand LLP

(57) ABSTRACT

One embodiment for forming a shaped substrate for an electronic device can form a shaped perimeter to define the substrate shape on the surface of a substrate. The shaped perimeter can extend at least part way into the substrate. A subsequent thinning process can remove substrate material and expose the shaped perimeter effectively forming shaped dies from the substrate.

17 Claims, 9 Drawing Sheets

(56) References Cited

OTHER PUBLICATIONS

Yablonovitch, "Epitaxial GaAs Lift-off" in Properties of Gallium Arsenide, pp. 672-676 (1996) 3rd ed., ed. by M.R. Brozel, G.E. Stillman, INSPEC, The Institute of Electrical Engineering, London.

Yablanovitch, "Epitaxial GaAs Lift-off" in Properties of Gallium Arsenide, pp. 672-676 (1996) 3rd ed., ed. by M.R. Brozel, G.E. Stillman, INSPEC, The Institute of Electrical Engineering, London.

* cited by examiner

Section A-A

US 9,053,952 B2

SILICON SHAPING

FIELD OF THE DESCRIBED EMBODIMENTS

The described embodiments relate generally to integrated circuits and more particularly to integrated circuits with shaped substrates.

BACKGROUND

Integrated circuits have long become a mainstay of many electronic designs. Many items such as processors, memories, custom electronic designs including application specific integrated circuits (ASICs), field programmable gate arrays and sensors use integrated circuit device technology to manufacture these items. Integrated circuit technologies can produce devices en masse, typically on a substrate commonly referred to as a wafer. Individual devices can be separated from the wafer to form dies that include the device. Dies commonly have a square or rectangular shape. This shape is largely an artifact of the sawing technique that is used to separate individual dies from an original substrate.

Often, the initial substrate can be too thick for a particular application. To address substrate thickness, the substrate can be subsequently thinned as one of the final manufacturing steps. Thinned substrates can be very thin, often 200 microns or less. Consequently, the thinned substrate can be more fragile than regular substrate. Furthermore, the square or rectangular shapes of the dies can exacerbate substrate damage, particularly when the substrates are handled after manufacture, but before installation into a device or product. Sharp corners of the die can be prone to damage and can incur fractures to the substrate and can contribute to device failures.

Therefore, what is desired is a way to easily produce thinned integrated circuit substrates without sharp corners to help reduce fractures and damage that can occur on the substrate.

SUMMARY OF THE DESCRIBED EMBODIMENTS

This paper describes various embodiments that relate to shaped substrates that can be used for integrate circuits or sensors. In one embodiment, a method for forming a shaped integrated circuit can include the steps of receiving a substrate, forming a curvilinear trench that can partially extend into the substrate and define a shape of the shaped substrate and attaching a handle to the received substrate. Next, the substrate can be thinned until the formed trenches are exposed and individual dies are formed. The handle can be removed and the individual dies are released.

In another embodiment, an integrated circuit substrate can include multiple integrated circuit areas and a curvilinear trench formed around each integrated circuit area where the trench only projects part way through the substrate.

In yet another embodiment, computer code for forming a shaped substrate can include code for receiving an integrated circuit substrate, computer code for forming a curvilinear trench that defines a die area and computer code for thinning the received substrate.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION OF SELECTED EMBODIMENTS

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Substrates used for integrated circuits, sensors and similar devices can often be thinned to fulfill one or more physical requirements for a final application. The thinned substrate based devices can be relatively more fragile compared to their non-thinned counterparts. For example, thinned substrates can be more easily chipped, cracked or fractured compared to regular substrates.

Devices based on thinned substrates are typically formed en masse on a wafer. The devices are typically separated with a sawing operation that creates square or rectangular dies. Unfortunately, the relatively sharp corners that are a result of the sawing operation can be subject to damage as the thinned substrate is handled. Cracks and fractures can originate from the corners and can damage the device and adversely affect device yield.

One approach to improve the robustness of thin substrate based devices can address the final shape of the thin substrate. In one embodiment, a shaped perimeter can be formed on the substrate prior to a thinning operation where the shaped perimeter can be used to define the final shape of the resulting device. The shaped perimeter can include rounded corners that can improve the robustness of the thinned device.

Figure 1:
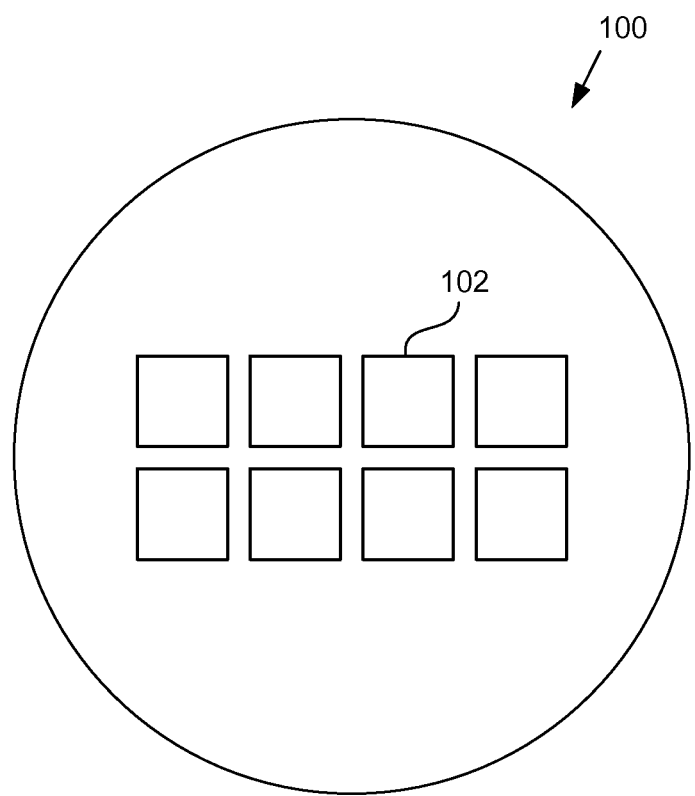
FIG. 1 is a simplified prior art diagram of a substrate for forming integrated circuits.

FIG. 1 is a simplified prior art diagram of a substrate 100 for forming integrated circuits. In one embodiment, the substrate 100 can be silicon. In other embodiments, the substrate can be gallium arsenide or any other technically feasible material. Integrated circuits can be formed on the substrate and located within integrated circuit areas that can later be separated from the substrate 100 to form dies 102. Dies are often separated from the substrate 100 with a saw such that the resultant dies 102 are rectilinear in shape. These dies 102 can include sharp corners as shown in FIG. 1. Sharp corners can allow relatively more stress to be subjected to the die 102 during handling and allow stress induced failures to occur, thereby limiting part yields.

One approach to reducing stress induced failures on a die seeks to replace traditionally sawn dies that include sharp corners with shaped dies that can include rounded corners. In one embodiment, dies can be shaped by forming a shaped perimeter around the die. The perimeter can take the form of a trench that extends partially through the substrate 100. After forming the shaped perimeter, a handle can be affixed to the substrate and the substrate can subsequently be thinned. In one embodiment, the shaped perimeter features can be exposed by the thinning and the outline of the dies can take the form of the shaped perimeter. After the thinning step, the handle can be removed and the dies can be separated and can undergo further processing for packaging or bond wire fixture, for example.

Figure 2:
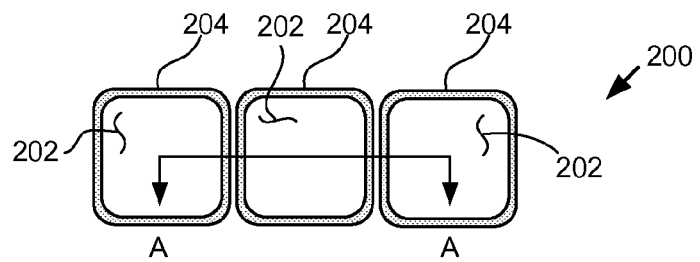
FIG. 2 is a simplified diagram of shaped dies disposed on a substrate in accordance with one embodiment described in the specification.

FIG. 2 is a simplified diagram 200 of shaped dies disposed on a substrate in accordance with one embodiment described in the specification. The outline of the substrate has been omitted from FIG. 2 to simplify the illustration. Each die 202 can include a shaped perimeter 204. In one embodiment, the shaped perimeter 204 can be formed with trenches that can extend at least partially into the substrate. As shown, each die can be associated with a shaped perimeter 204. The shaped perimeter 204 can used to define die edges and can separate the dies 202 from the substrate, particularly when the shaped perimeter 204 is formed with a trench. Furthermore, the shaped perimeter can allow rounded edges to be formed on the dies 202 that can reduce stress induced failures on dies. FIGS. 2 though FIGS. 6A-6B can show the shaped substrate at different intermediate steps of formation.

Figure 3:
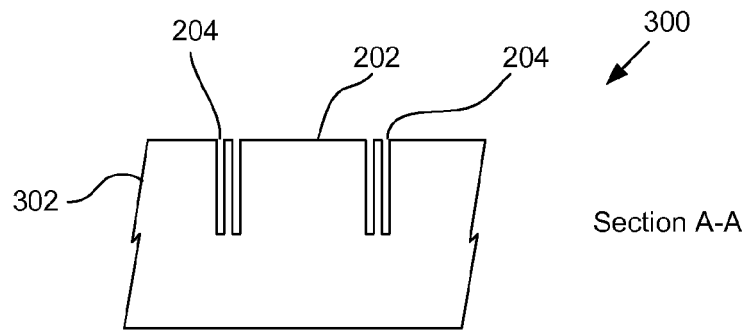
FIG. 3 is an illustration of cross section A-A shown in FIG. 2.

FIG. 3 is an illustration 300 of cross section A-A shown in FIG. 2. The die 202 is shown disposed between shaped perimeters 204. The shaped perimeter 204 is shown in the figure as trenches partially extending through substrate 302. In one embodiment, the shaped perimeter 204 can be formed with deep ion reaction etch (DRIE) techniques. DRIE techniques can provide very high aspect ratio features such as this relatively tall and relatively narrow shaped perimeter 204 feature as shown.

Figure 4:
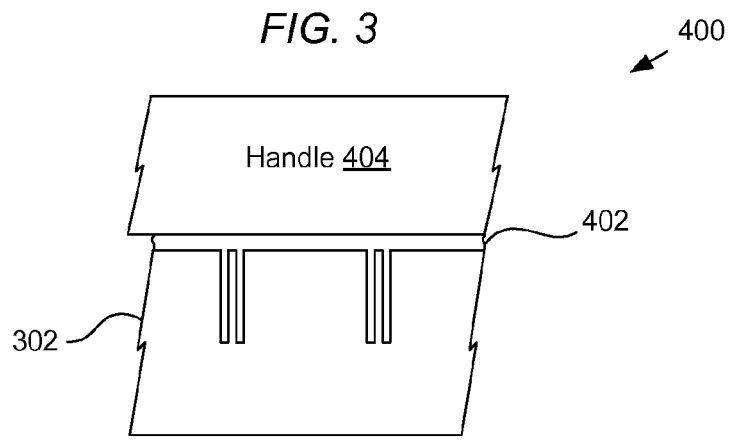
FIG. 4 is an illustration of the cross section A-A after a handle object is attached to the substrate.

FIG. 4 is an illustration 400 of the cross section A-A after a handle object is attached to the substrate 302. Subsequent thinning of the substrate can require that a handle 404 be attached to substrate 302. The handle 404 can provide stability as well as a means to support the substrate 302 during the thinning process. In one embodiment, the handle 404 can be formed from a borosilicate glass. In another embodiment, the handle can be formed from silicon, or gallium arsenide. Any technically feasible material can be used for the handle 404 provided the handle 404 includes a thermal coefficient of expansion relatively similar to that of the substrate 302 and can withstand processing steps along with substrate 302. Adhesive 402 can be used to bond handle 404 to substrate 302. Any technically feasible adhesive can be used. In one embodiment an ultra violet releasable adhesive can be used, particularly when the handle 404 is formed from a transparent or translucent material such as glass or borosilicate glass.

Figure 5:
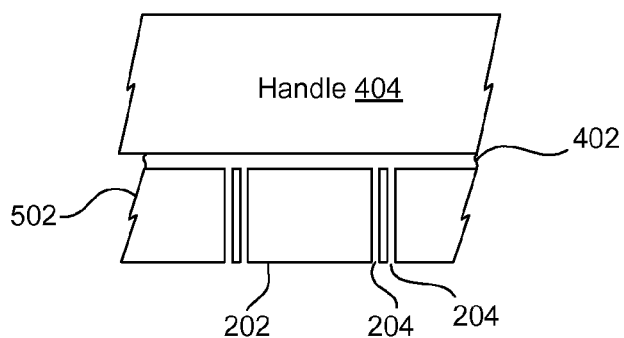
FIG. 5 is an illustration of the cross section A-A showing a thinned substrate.

FIG. 5 is an illustration of the cross section A-A showing a thinned substrate 502. In one embodiment, the substrate 302 in FIG. 4 can be ground to form thinned substrate 502 and expose the shaped perimeter 204 features. As shown, handle 404 can remain be attached to thinned substrate 502 with adhesive 402. The thinned substrate 502 shows the dies 202 separated from each other. The shaped perimeter 204 can become the shaped outline of the die 202. In one embodiment, the shape of the perimeter 204 is not constrained to linear or rectilinear shapes, but can be relatively arbitrary. In one embodiment, the shaped perimeter 204 can be a curvilinear shape and can include round corners.

Figure 6A:
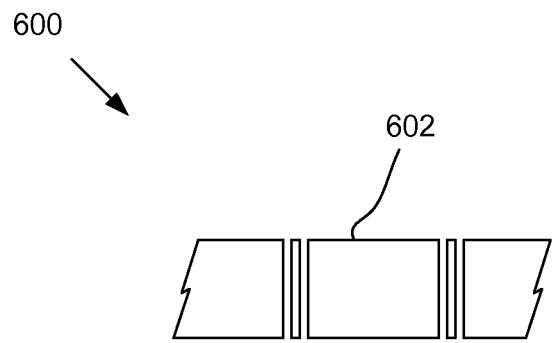
FIG. 6A is an illustration of the cross section A-A showing a released die after handle is removed.
Figure 6B:
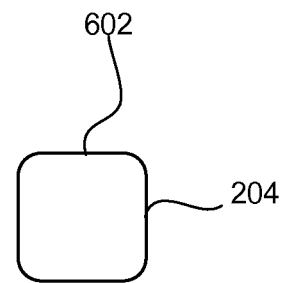
FIG. 6B shows a possible top view of die in FIG. 6A.

FIG. 6A is an illustration of the cross section A-A of substrate 600 showing a released die 602 after handle 404 is removed. In one embodiment, handle 404 can be released from dies 602 as described above in FIG. 4. FIG. 6B shows a possible top view of die 602. The outline of 602 can be the shaped perimeter 204.

Figure 7A:
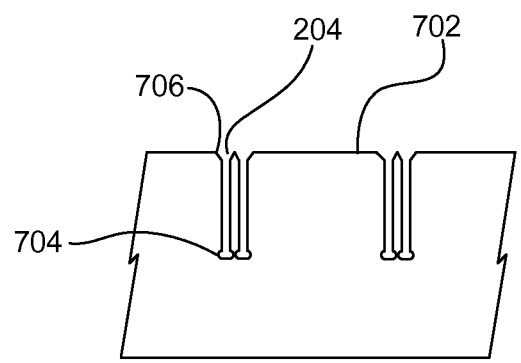
FIG. 7A shows a cross section of a substrate with a shaped perimeter that can include additional shaping features.
Figure 7B:
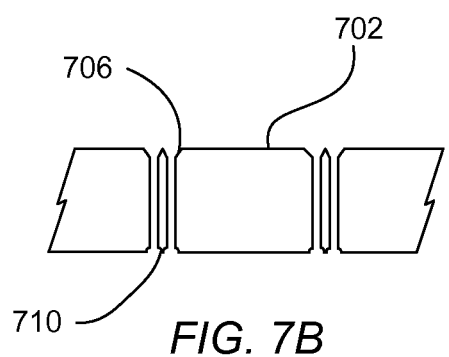
FIG. 7B shows a cross section of the substrate in FIG. 7A after the substrate has been thinned.

FIG. 7A shows a cross section of a substrate 302 with a shaped perimeter 204 that can include additional shaping features. In one embodiment, an upper portion of the shaped perimeter 204 can receive chamfers 706. Chamfers 706 introduced on the upper surface of the substrate 302 can remove sharp corners that will be exposed when die 702 is singulated in later steps. In one embodiment, chamfers 706 can be formed by any technically feasible means such as DRIE. Similarly, elongated chambers or cavities 704 can be formed on the bottom of the shaped perimeter 204. These cavities 704 can also form chamfers that are exposed when the substrate 302 is thinned. FIG. 7B shows a cross section of the substrate in FIG. 7A after the substrate 302 has been thinned. Die 702 can include chamfers 706 on a first surface and chamfers 710 on a second surface. The chamfers 710 on the second surface can be the portion of the cavity 704 that was not removed by the thinning of substrate 302.

Figure 8:
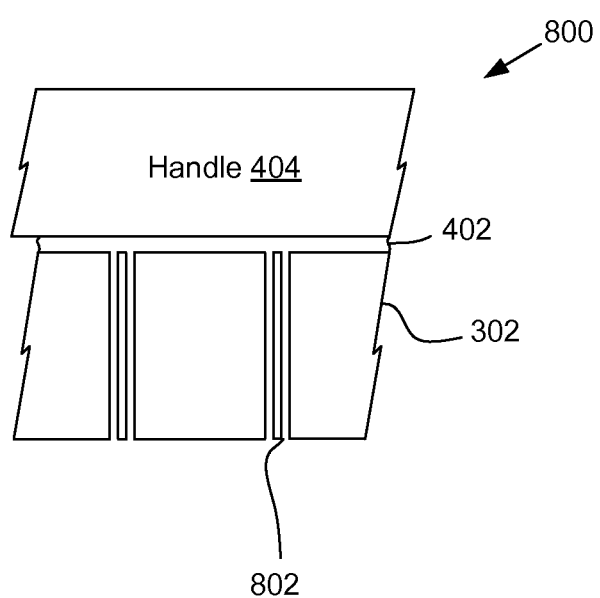
FIG. 8 is a cross sectional view of a substrate showing another embodiment of a shaped substrate.

FIG. 8 is a cross sectional view 800 of a substrate showing another embodiment of a shaped substrate. In this embodiment, the process described by FIG. 3 and FIG. 4 can be used to form shaped perimeters 204 and to bond handle 404 to the substrate 302. The shaped perimeters 204 can be extended beyond the amount shown in FIG. 4 by forming additional shaped perimeters 802 on a surface opposed to the initial surface receiving the shaped perimeters 204. In one embodiment, additional shaped perimeters 802 can be substantially similar to shaped perimeter 204 and can intersect and connect with shaped perimeters 204. In this fashion, a complete trench can be formed that extends from a first side of the substrate 302 to a second side of the substrate 302. In one embodiment, the additional shaped perimeters 802 can be formed with DRIE. Subsequent processing steps can include substrate 302 thinning and handle 404 removal as describe above.

Figure 9A:
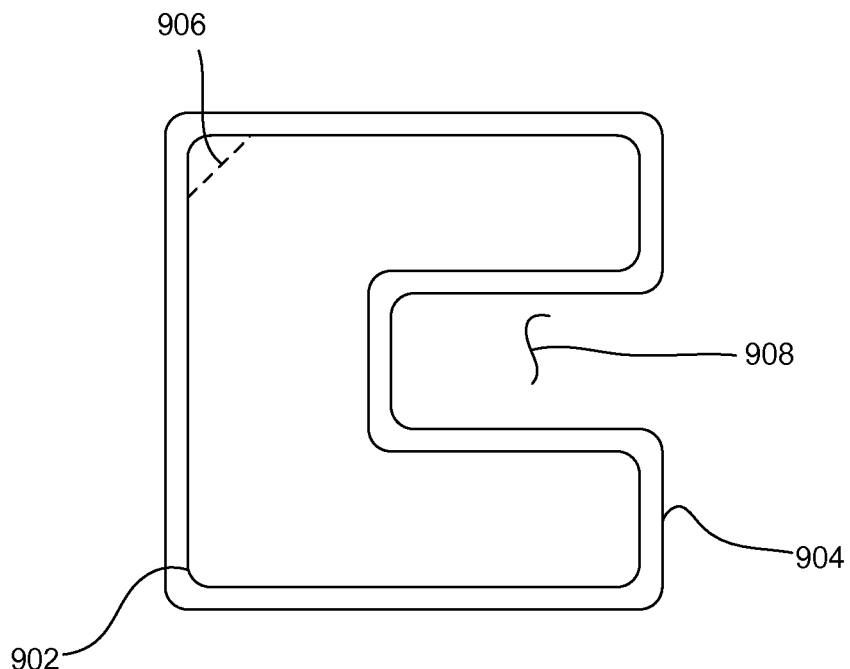
FIGS. 9A and 9B can show other curvilinear shapes that can be used for a shaped substrate.
Figure 9B:
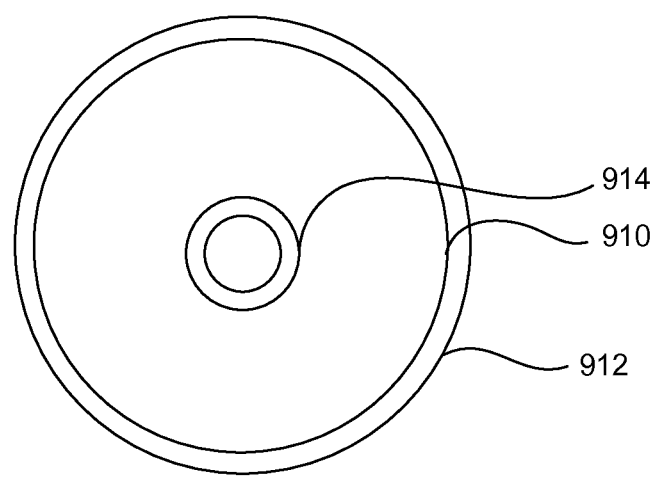

FIGS. 9A and 9B can show other curvilinear shapes that can be used for a shaped substrate. Shaped substrates can include shapes that can be arbitrarily complex and can include cut-outs and curves that can enable the shaped substrate to fit more easily within a fixture, a machine or a product. FIG. 9A shows a C shaped die 902 having outer perimeter 904 formed on a substrate. The large cut-out area 908 can allow the C shaped die 902 to fit around standoffs, screws, mounting points or other features that may otherwise make the positioning of the C shaped die 902 relatively more difficult. Although such die shapes may not be efficient in terms of die utilization, the design may not be die usage constrained. For example, in some embodiments, inefficient utilization of die area can be an acceptable tradeoff for mounting ease. C shaped die 902 can also include a chamfered corner 906 as shown with a dotted line. The chamfered corner 906 can also reduce sharp corners. FIG. 9B shows yet another embodiment of a shaped substrate. In this embodiment, the die 910 can be shaped like an annular ring. In this embodiment, circular perimeters 912 and 914 can define the die shape 910. This embodiment may be useful for positioning within a product that can include a mounting screw or feature in the center of die 910.

Figure 10A:
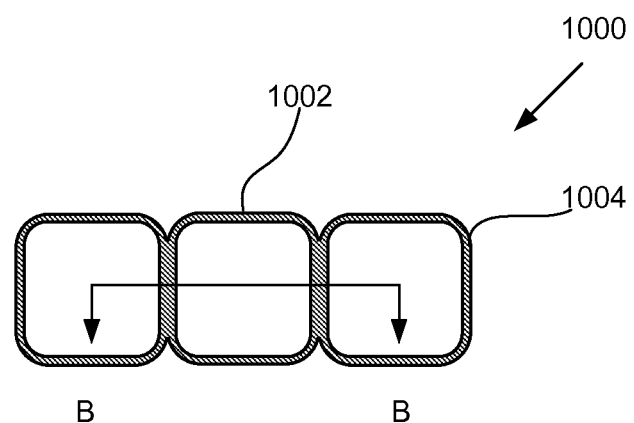
FIGS. 10A and 10B illustrate another embodiment of a shaped substrate.
Figure 10B:
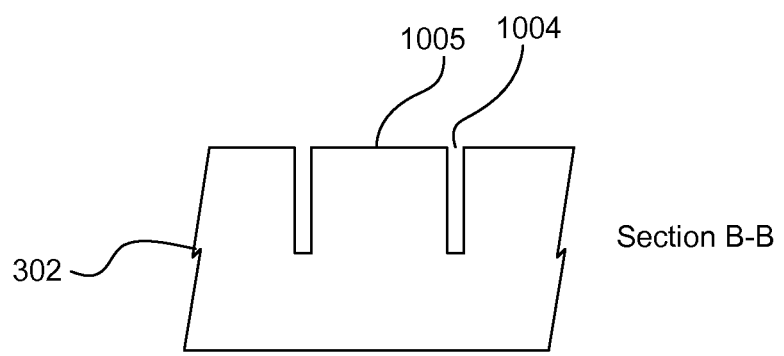

FIGS. 10A and 10B illustrate another embodiment 1000 of a shaped substrate. In this embodiment, the shaped perimeters 204 shown in FIG. 2 have been combined between adjacent dies 1002. Thus, a shaped perimeter 1004 can be shared between two or more dies 1002. In one embodiment, the shared shaped perimeter 1004 can offer an advantage with respect to die usage efficiency by requiring less substrate area to be used for shaped perimeters 1004. FIG. 10B shows cross section B-B for FIG. 10A. The shared shaped perimeter 1004 is more clearly shown surrounding die 1005. Although not shown here, the steps described in FIG. 3-FIG. 8 can be applied to this embodiment as well. For example, chamfered shaped perimeters as describe in FIG. 7A can be added to shaped perimeter 1004.

Figure 11:
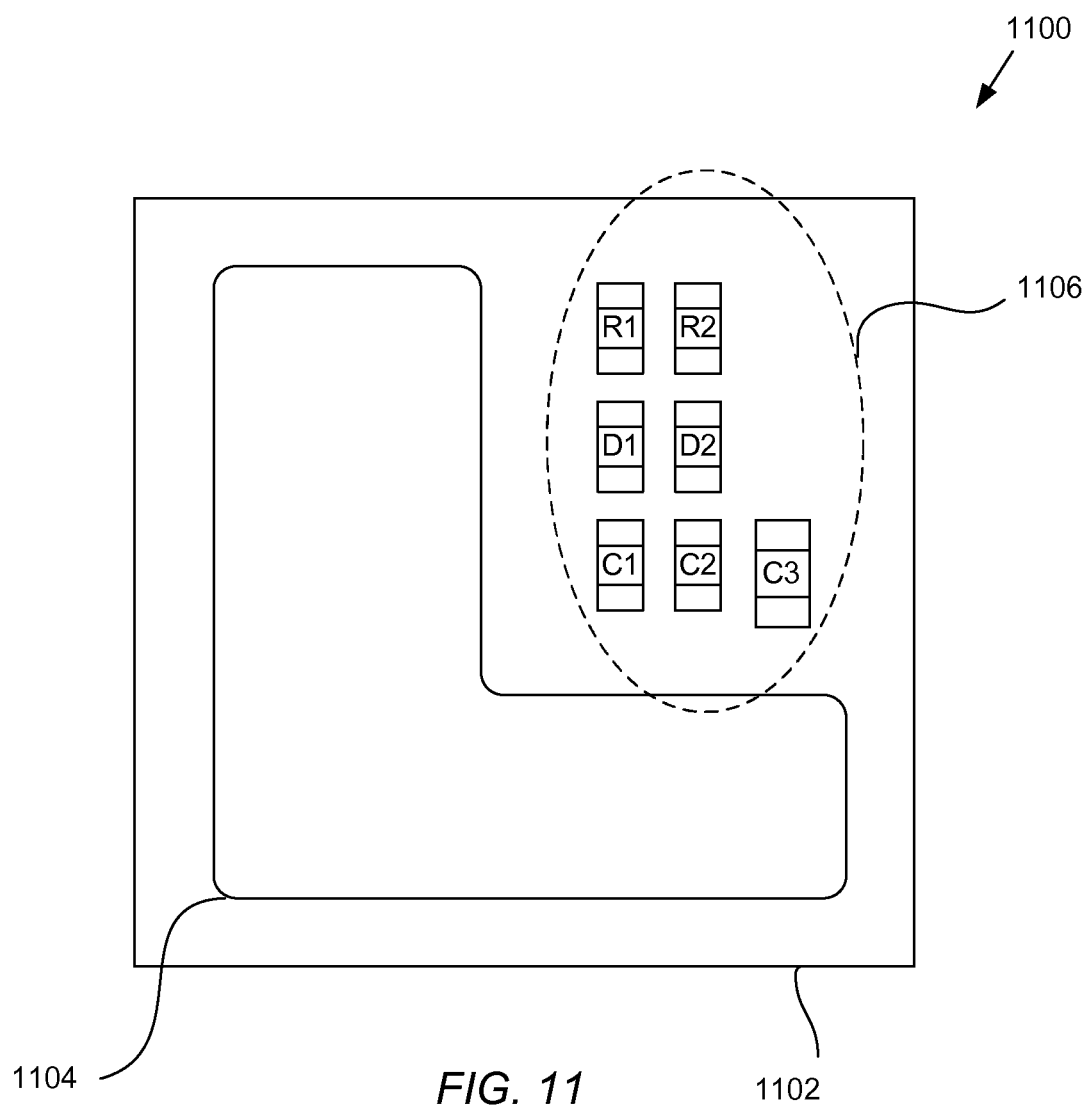
FIG. 11 is an example of a shaped substrate system.

FIG. 11 is an example of a shaped substrate system 1100. In this example, shaped substrate 1104 can be used in conjunction with other electrical components 1106 on a printed circuit board 1102. In one embodiment, the shaped substrate 1104 can enable advantageous placement of electrical components 1106 such that trace length may be improved between electrical components 1106 and shaped substrate 1104.

Figure 12:
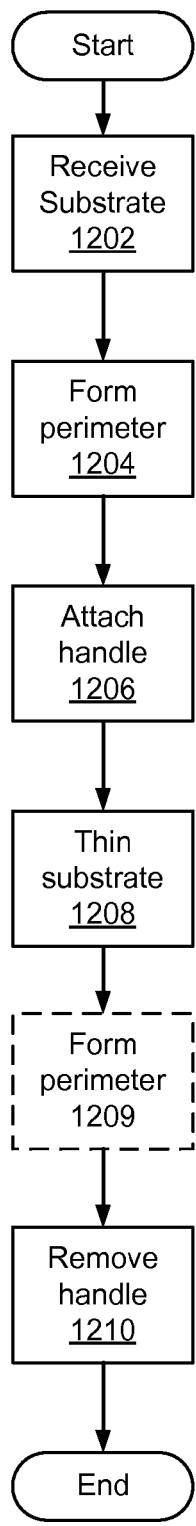
FIG. 12 is a flow chart of method steps for forming a shaped substrate in accordance with one embodiment described in the specification.

FIG. 12 is a flow chart of method steps for forming a shaped substrate in accordance with one embodiment described in the specification. The method can begin in step 1202 where the substrate is received. In step 1204, perimeters can be formed on the substrate. In one embodiment, the perimeters can be curvilinear shapes that can partially extend into the substrate. In step 1206, a handle can be attached to the substrate to increase substrate stability and ease handling in subsequent steps. In step 1208, the substrate can be thinned. In one embodiment, the substrate can be thinned by back grinding. In step 1210 the handle can be removed and individual dies can be formed and the method can end. In some embodiments, an optional step 1209 can be included to form additional perimeters shapes on a second side of the substrate.

Figure 13:
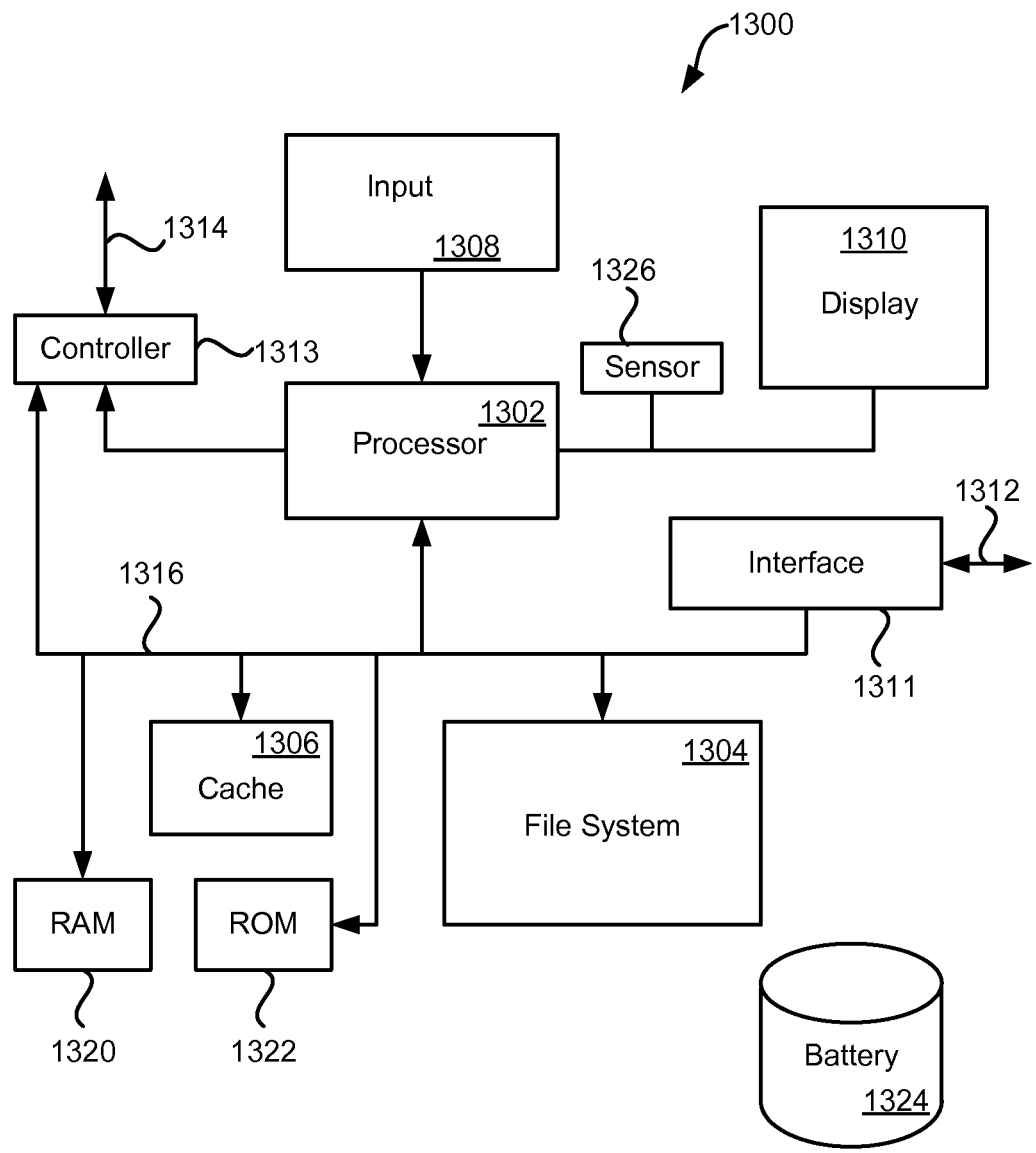
FIG. 13 is a block diagram of an electronic device suitable for controlling some of the processes in the described embodiment

FIG. 13 is a block diagram of an electronic device suitable for controlling some of the processes in the described embodiment. Electronic device 1300 can illustrate circuitry of a representative computing device. Electronic device 1300 can include a processor 1302 that pertains to a microprocessor or controller for controlling the overall operation of electronic device 1300. Electronic device 1300 can include instruction data pertaining to manufacturing instructions in a file system 1304 and a cache 1306. File system 1304 can be a storage disk or a plurality of disks. In some embodiments, file system 1304 can be flash memory, semiconductor (solid state) memory or the like. The file system 1304 can typically provide high capacity storage capability for the electronic device 1300. However, since the access time to the file system 1304 can be relatively slow (especially if file system 1304 includes a mechanical disk drive), the electronic device 1300 can also include cache 1306. The cache 1306 can include, for example, Random-Access Memory (RAM) provided by semiconductor memory. The relative access time to the cache 1306 can substantially shorter than for the file system 1304. However, cache 1306 may not have the large storage capacity of file system 1304. Further, file system 1304, when active, can consume more power than cache 1306. Power consumption often can be a concern when the electronic device 1300 is a portable device that is powered by battery 1324. The electronic device 1300 can also include a RAM 1320 and a Read-Only Memory (ROM) 1322. The ROM 1322 can store programs, utilities or processes to be executed in a non-volatile manner. The RAM 1320 can provide volatile data storage, such as for cache 1306

Electronic device 1300 can also include user input device 1308 that allows a user of the electronic device 1300 to interact with the electronic device 1300. For example, user input device 1308 can take a variety of forms, such as a button, keypad, dial, touch screen, audio input interface, visual/image capture input interface, input in the form of sensor data, etc. Still further, electronic device 1300 can include a display 1310 (screen display) that can be controlled by processor 1302 to display information to the user. Data bus 1316 can facilitate data transfer between at least file system 1304, cache 1306, processor 1302, and controller 1313. Controller 1313 can be used to interface with and control different manufacturing equipment through equipment control bus 1314. For example, control bus 1314 can be used to control a computer numerical control (CNC) mill, a press, an injection molding machine or other such equipment. For example, processor 1302, upon a certain manufacturing event occurring, can supply instructions to control manufacturing equipment through controller 1313 and control bus 1314. Such instructions can be stored in file system 1304, RAM 1320, ROM 1322 or cache 1306.

Electronic device 1300 can also include a network/bus interface 1311 that couples to data link 1312. Data link 1312 can allow electronic device 1300 to couple to a host computer or to accessory devices. The data link 1312 can be provided over a wired connection or a wireless connection. In the case of a wireless connection, network/bus interface 1311 can include a wireless transceiver. Sensor 1326 can take the form of circuitry for detecting any number of stimuli. For example, sensor 1326 can include any number of sensors for monitoring a manufacturing operation such as for example a Hall Effect sensor responsive to external magnetic field, an audio sensor, a light sensor such as a photometer, computer vision sensor to detect clarity, a temperature sensor to monitor a molding process and so on.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A method for forming a shaped die from a substrate, the substrate including at least one circuit element, the method comprising:
    forming a trench partially extending through a thickness of the substrate, the trench defining a first edge of the shaped die and a second edge the shaped die opposite the first edge, wherein a terminal end of the trench includes an elongated cavity that chamfers the second edge;
    attaching a handle to the substrate;
    thinning the substrate such that the trench extends all the way through the thickness of the substrate; and
    separating the shaped die from a remaining portion of the substrate by removing the handle.

2. The method of claim 1, wherein forming the trench involves direct ion reactive etching of the substrate.

3. The method of claim 1, wherein forming the trench involves defining a perimeter of the shaped die, the perimeter including a curved corner.

4. The method of claim 1, wherein forming the trench involves chamfering the first edge of the shaped die.

5. The method of claim 1, wherein the trench defines a perimeter of each of a plurality of shaped dies on the substrate.

6. The method of claim 1, further comprising, prior to separating the shaped die, forming a second trench that intersects the trench.

7. The method of claim 1, wherein the thinning is performed by back-grinding the substrate.

8. A method of forming a shaped die from a substrate, the shaped die configured to support an integrated circuit, the method comprising:
    etching a trench partially through the substrate, the trench defining a first edge of the shaped die and a second edge of the shaped die opposite the first edge, wherein the etching forms a first chamfer along the first edge and a second chamfer along the second edge;
    coupling a handle to the shaped die; and
    thinning the substrate such that the trench extends through an entire thickness of the substrate; and
    separating the shaped die from the handle.

9. The method of claim 8, wherein etching the trench includes defining a perimeter of the shaped die, wherein the perimeter includes a rounded corner.

10. The method of claim 8, wherein etching the trench includes defining a perimeter of the shaped die, wherein the perimeter includes a cut out area configured to accommodate a component within an electronic device.

11. The method of claim 8, wherein etching the trench includes defining a perimeter of the shaped die, wherein the perimeter has an annular shape.

12. The method of claim 11, wherein the annular shape includes an opening for accommodating a feature of an electronic device.

13. The method of claim 8, wherein forming the trench involves direct ion reactive etching of the substrate.

14. The method of claim 8, wherein a second shaped die is formed from the substrate, the method further comprising:
    etching a second trench adjacent the trench, the second trench defining a first edge of the second shaped die and a second edge of the second shaped die opposite the first edge of the second shaped die, wherein etching the second trench chamfers the first edge and the second edge of the second shaped die.

15. The method of claim 8, wherein a plurality of shaped dies are formed from the substrate, wherein each of the plurality of shaped dies is defined by a corresponding trench.

16. The method of claim 8, wherein a second shaped die is formed from the substrate, wherein etching the trench defines a first edge of the second shaped die and a second edge of the second shaped die opposite the first edge, wherein etching the trench chamfers the first edge and the second edge of the second shaped die.

17. The method of claim 8, wherein prior to separating the shaped die, forming a second trench that intersects the trench.

* * * * *